(12) United States Patent
Komatsu et al.

(10) Patent No.: US 11,881,265 B2
(45) Date of Patent: Jan. 23, 2024

(54) MEMORY SYSTEM AND READ METHOD

(71) Applicant: KIOXIA CORPORATION, Tokyo (JP)

(72) Inventors: Yuki Komatsu, Kawasaki Kanagawa (JP); Yasuyuki Ushijima, Yokohama Kanagawa (JP); Katsuyuki Shimada, Ota Tokyo (JP)

(73) Assignee: Kioxia Corporation, Tokyo (JP)

( * ) Notice: Subject to any disclaimer, the term of this patent is extended or adjusted under 35 U.S.C. 154(b) by 45 days.

(21) Appl. No.: 17/682,799

(22) Filed: Feb. 28, 2022

(65) Prior Publication Data

US 2022/0406382 A1  Dec. 22, 2022

(30) Foreign Application Priority Data

Jun. 22, 2021  (JP) ................................ 2021-103293

(51) Int. Cl.
| G11C 16/26 | (2006.01) |
| G11C 16/10 | (2006.01) |
| G11C 29/42 | (2006.01) |
| G11C 16/34 | (2006.01) |

(52) U.S. Cl.
CPC ............ G11C 16/102 (2013.01); G11C 16/26 (2013.01); G11C 16/3409 (2013.01); G11C 29/42 (2013.01)

(58) Field of Classification Search
CPC ... G11C 16/102; G11C 16/26; G11C 16/3409; G11C 29/42; G11C 11/5628; G11C 16/0483; G11C 29/028; G11C 29/021
See application file for complete search history.

(56) References Cited

U.S. PATENT DOCUMENTS

| 8,804,435 B2 | 8/2014 | Matsunaga |
| 8,879,325 B1 | 11/2014 | Bar et al. |
| 9,431,118 B1 | 8/2016 | Bar et al. |
| 2010/0208519 A1 | 8/2010 | Shiga et al. |
| 2014/0029355 A1* | 1/2014 | Choi ................. G11C 16/0483 365/201 |
| 2021/0011658 A1* | 1/2021 | Tai ......................... G11C 16/32 |
| 2021/0027845 A1* | 1/2021 | Lu .......................... G06F 3/0604 |

FOREIGN PATENT DOCUMENTS

| JP | 2010192049 A | 9/2010 |
| JP | 2012203957 A | 10/2012 |
| JP | 2013122793 A | 6/2013 |

* cited by examiner

*Primary Examiner* — Jay W. Radke
(74) *Attorney, Agent, or Firm* — Kim & Stewart LLP

(57) ABSTRACT

A memory system includes non-volatile memory cells for storing multiple bit data and a controller configured to control to apply read voltages to the non-volatile memory cells at different threshold levels to read data written to the non-volatile memory cells. The non-volatile memory cells comprise different sub-groups. The controller stores first information indicating a first initial value for each of the different threshold level of the read voltages, second information that indicates whether data can be successfully read from each sub-group when the respective different threshold levels of the read voltages are set to the first initial values, and third information that indicates a second initial value for each different threshold level of the read voltages for at least one sub-group for which data reading was unsuccessful when a read voltage was set to the first initial value.

20 Claims, 12 Drawing Sheets

FIG. 6

| DEFAULT TABLE | | | | | | | |
|---|---|---|---|---|---|---|---|
| READ VOLTAGE | VA | VB | VC | VD | VE | VF | VG |
| INITIAL VALUE | VA0 | VB0 | VC0 | VD0 | VE0 | VF0 | VG0 |

| SHIFT TABLE | | | | | | | |
|---|---|---|---|---|---|---|---|
| SHIFT PATTERN / INDEX | Shift[A] | Shift[B] | Shift[C] | Shift[D] | Shift[E] | Shift[F] | Shift[G] |
| 0 | 0 | 0 | 0 | 0 | 0 | 0 | 0 |
| 1 | 0 | 1 | -1 | -1 | 0 | 0 | 0 |
| 2 | 0 | -1 | -1 | 0 | -2 | -1 | -10 |
| 3 | 2 | -1 | -1 | 0 | -1 | 1 | -2 |
| ... | ... | ... | ... | ... | ... | ... | ... |
| 254 | 0 | -3 | -5 | -8 | -10 | -12 | -15 |
| 255 | 2 | -5 | -7 | -10 | -12 | -14 | -17 |

| L1 TABLE (L2 FLAG) | | | | | | | | | |
|---|---|---|---|---|---|---|---|---|---|
| 0 | 0 | 1 | 1 | 1 | ... | 0 | 0 | 1 | 0 |

36d

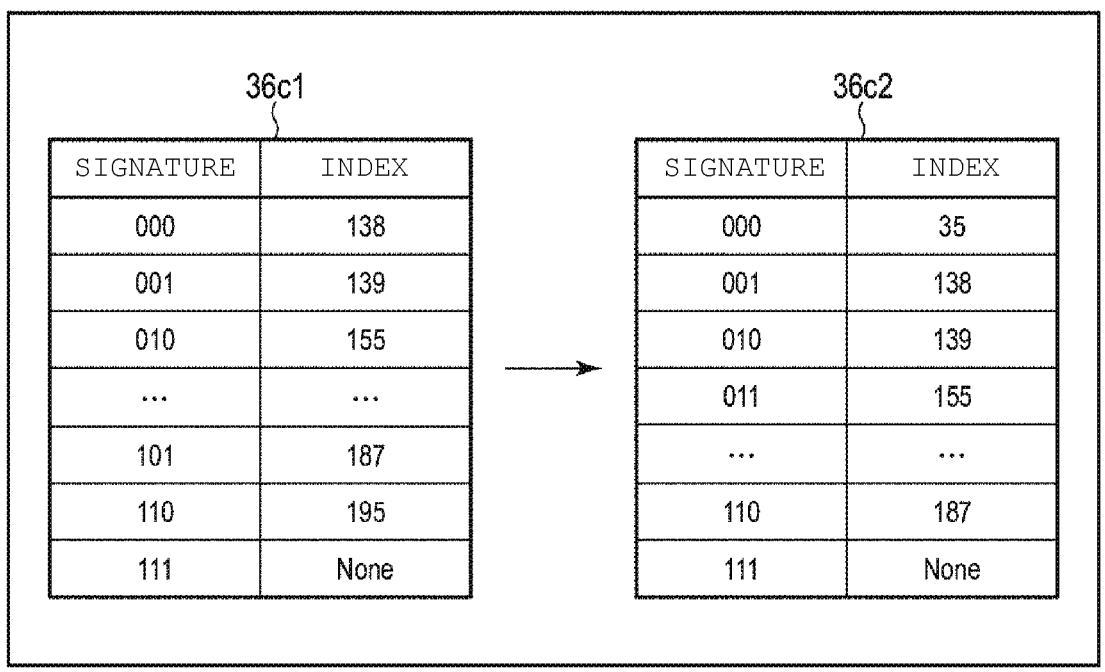

FIG. 14

| NORMAL READ SUCCESS RATE (L1 TABLE HIT RATE) | NORMAL READ FAILURE RATE (L2 TABLE USE RATE) | |
|---|---|---|
| 70% | 30% | |
| | L2 TABLE HIT RATE | L3 TABLE USE RATE |
| | 80% | 20% |
| | L2 TABLE SIZE 24% (= 30 × 80%) | L3 TABLE SIZE 6% (= 30 × 20%) |

FIG. 15A

| INDEX | NUMBER OF BLOCKS |
|---|---|
| 127 | 16 |
| 156 | 14 |
| 209 | 2 |

FIG. 15B

| INDEX | NUMBER OF BLOCKS |
|---|---|
| 213 | 9 |
| 156 | 8 |
| 127 | 5 |
| 139 | 5 |
| 155 | 4 |
| 209 | 1 |

FIG. 15C

| INDEX | NUMBER OF BLOCKS |
|---|---|
| 139 | 15 |
| 155 | 5 |
| 127 | 4 |
| 156 | 4 |
| 138 | 3 |
| 209 | 1 |

FIG. 15D

| INDEX | NUMBER OF BLOCKS |
|---|---|
| 138 | 12 |
| 139 | 10 |
| 155 | 4 |
| 213 | 3 |
| 156 | 2 |
| 127 | 1 |

FIG. 17A
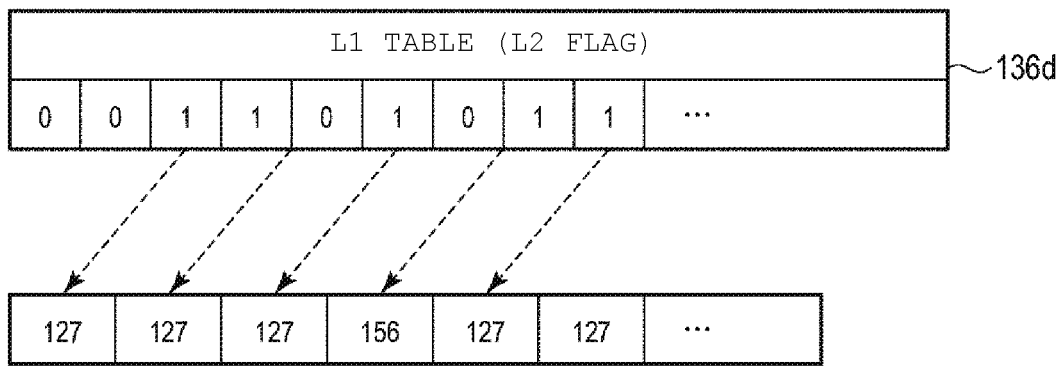
FIG. 17B
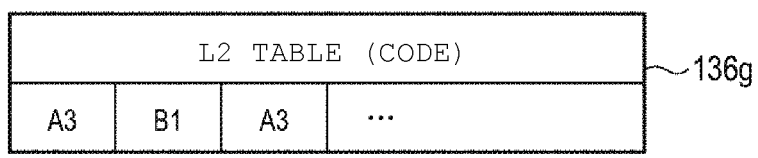
FIG. 18
| CODE | INDEX |
|---|---|
| A3 | 127 |
| B1 | 156 |
| C1 | 209 |
| D1 | 213 |
| E1 | 139 |
| ... | ... |

MEMORY SYSTEM AND READ METHOD

CROSS-REFERENCE TO RELATED APPLICATION

This application is based upon and claims the benefit of priority from Japanese Patent Application No. 2021-103293, filed Jun. 22, 2021, the entire contents of which are incorporated herein by reference.

FIELD

Embodiments described herein relate generally to a memory system and a read method for reading data in a memory system.

BACKGROUND

A memory system of one type includes a memory device including a plurality of memory cells. In such a memory system a reading voltage is applied at the time of reading to a word line that is connected to a memory cell that is to be read. If the read voltage value is not an appropriate value, there will be many errors in the data as read and it will take time for error correction processing and/or retrying of the data reading. As a result, read latency increases, and read performance deteriorates in the memory system.

BRIEF DESCRIPTION OF THE DRAWINGS

FIG. 6 is a diagram showing an example of a default table.

FIG. 7 is a diagram showing an example of a shift table.

FIG. 8 is a diagram showing an example of a first-stage index table.

FIG. 9 is a diagram showing an example of a second-stage index table.

FIG. 10 is a diagram showing an example of a third-stage index table.

FIG. 11 is a diagram showing an example of a signature and index table.

FIG. 14 is a diagram illustrating a memory size for storing an index of a shift pattern.

FIGS. 15A, 15B, 15C, and 15D are diagrams for showing aspects related to a bias in the use of shift pattern indices.

FIGS. 17A and 17B are diagrams for showing aspects related to an example of a first-stage index table and a second-stage index table.

FIG. 18 is a diagram showing an example of a code and index table.

DETAILED DESCRIPTION

Figure 1:
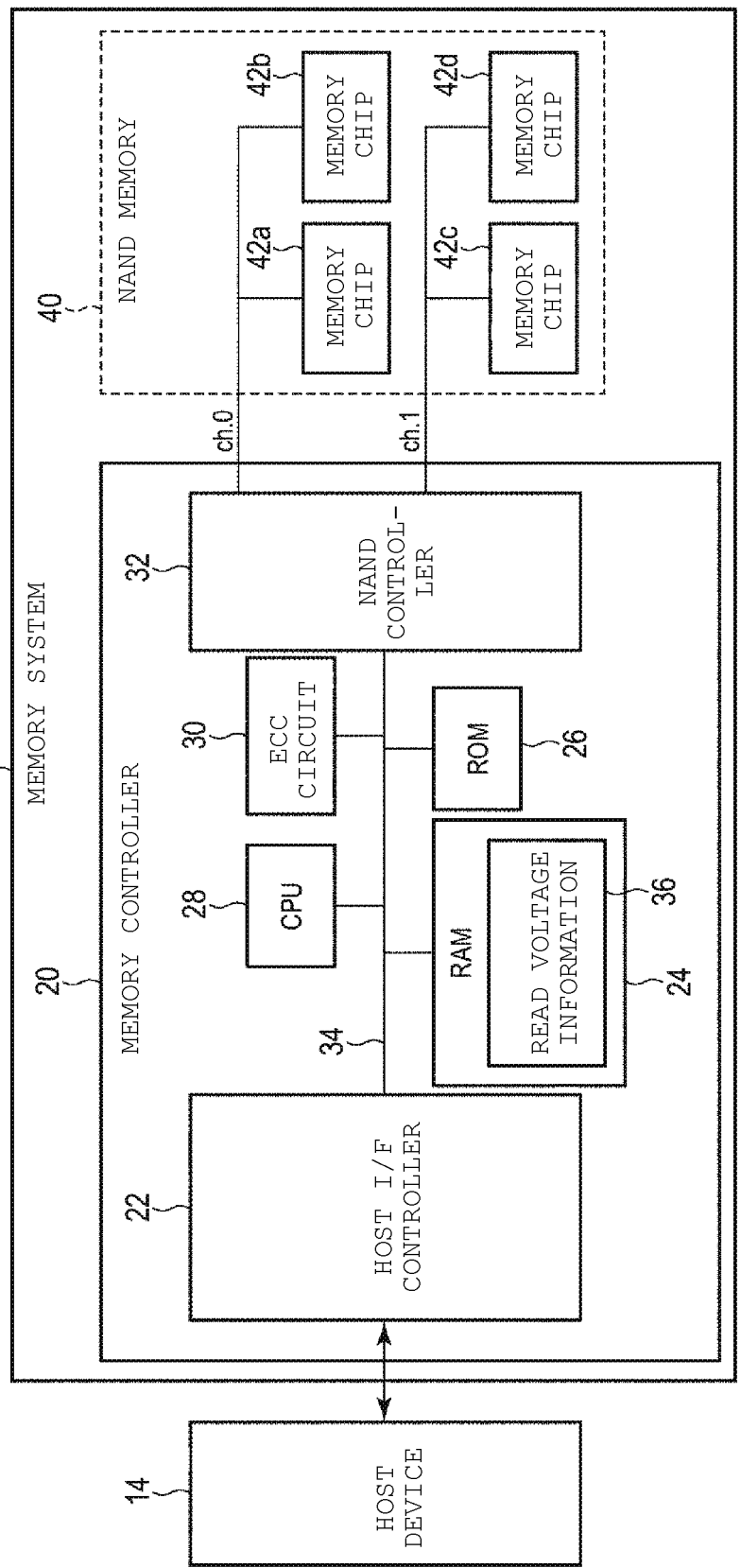
FIG. 1 is a block diagram of a memory system according to a first embodiment.

Embodiments provide a memory system and a data reading method capable of improving read performance.

In general, according to one embodiment, a memory system includes a non-volatile memory with memory cells for storing multiple bit data and a controller. The controller is configured to control to apply read voltages to the non-volatile memory at different threshold levels to read data written to the memory cells. The non-volatile memory comprises sub-groups of memory cells each sub-group including a plurality of memory cells. The controller stores: first information indicating a first initial value for each different threshold level of the read voltages, second information that indicates whether data can be successfully read from each sub-group when the respective different threshold levels of the read voltages are set to the first initial values, and third information that indicates a second initial value for each different threshold level of the read voltages for at least one sub-group for which data reading was unsuccessful when a read voltage was set to the first initial value.

Hereinafter, certain example embodiments will be described with reference to the drawings. The present disclosure is not limited to the structure, shape, arrangement, material, and the like of the elements described in these example embodiments. Modifications to the examples readily apparent to those skilled in the art are within the scope of the present disclosure. In order to clarify the description and depictions of elements and aspects may be represented schematically in the drawings, such the depicted dimensions, sizes, thicknesses, plane sizes, shapes, relative sizes between different elements, and/or the like for each element may be different with respect to an actual implementation of the embodiments. In the drawings, the corresponding elements in different may be given the same reference numerals and descriptions thereof may be omitted with respect to subsequently explained drawings. Although some elements or depicted aspects may be given a specific name or names in some instances, in general, these provided names are merely examples for purposes of overall description and these elements or aspects are to be understood as potentially corresponding to other names.

First Embodiment

FIG. 1 is a block diagram showing an example of a memory system 12 according to the first embodiment. The memory system 12 is connected to a host 14 via a cable, connector, socket, or network. The memory system 12 may be mounted on a printed wiring board provided in the host 14. The host 14 is an information processing device configured to control the memory system 12. The host 14 is, for example, a server device, a personal computer, an in-vehicle device, a mobile information processing device, or the like. The host 14 can issue an access request to the memory system 12. An access request may correspond to a read request or a write request.

The memory system 12 includes a memory controller 20 and a NAND flash memory 40 (hereinafter, referred to as NAND memory 40). The memory system 12 is, for example, a solid-state drive (SSD) or a universal flash storage (UFS) device. The NAND memory 40 is an example of a non-volatile memory. Instead of the NAND memory 40, another non-volatile memory type may be used. Other examples of non-volatile memory types are NOR type flash memory, an MRAM (Magneto-resistive Random Access Memory), a PRAM (Phase change Random Access Memory), a ReRAM (Resistive Random Access Memory), and a FeRAM (Ferroelectric Random Access Memory).

The memory controller 20 includes a host interface controller 22 (hereinafter, referred to as a host I/F controller 22), a RAM 24 (Random Access Memory), a ROM 26 (Read Only Memory), a CPU 28 (Central Processing Unit), an ECC circuit 30 (Error Correcting Code), and a NAND controller 32. The host I/F controller 22, the RAM 24, the ROM 26, the CPU 28, the ECC circuit 30, and the NAND controller 32 are connected to a bus 34. The memory controller 20 may be configured as a System on a Chip (SoC) in which the described elements are integrated into one chip. In other examples, some of these described elements may be provided outside the memory controller 20 as separate of discrete components.

The host I/F controller 22 controls the communication interface between the host 14 and the memory system 12 and data transfer between the host 14 and the RAM 24. The host I/F controller 22 operates under the control of the CPU 28. Examples of a communication interface between the host 14 and the memory system 12 are SCSI (Small Computer System Interface), SAS (Serial Attached SCSI), ATA (AT Attachment), SATA (Serial ATA), PCIe (PCI Express), Ethernet, Fibre channel, NVMe (NVM Express), USB (Universal Serial Bus), and UART (Universal Asynchronous Receiver/Transmitter).

Examples of the RAM 24 include, but are not limited to, DRAM (Dynamic Random Access Memory) or SRAM (Static Random Access Memory).

The RAM 24 functions as a buffer for data transfer between the host 14 and the NAND memory 40. The RAM 24 also provides the CPU 28 with a work area. A firmware program stored in the ROM 26 is loaded into the RAM 24 when the memory system 12 operates.

In the present embodiment, when the memory system 12 operates, read voltage information 36 initially stored in the NAND memory 40 can be loaded into the RAM 24. The read voltage information 36 includes information regarding a set value for the read voltage to be applied to each word line WL in a read operation for reading data/information from the NAND memory 40.

In the present embodiment, the memory controller 20 instructs the NAND memory 40 to set the value for the read voltage to be applied to each word line WL to an initial value and then execute a read operation. The threshold value of the memory cells provided in the NAND memory 40 changes due to various factors such as program disturb, read disturb, and data retention. If a read voltage that adjusts for the change in the threshold value is not used, the number of error bits (referred to as the Fail Bit Count (FBC)) in the read data increases. When the FBC is greater than the number of error bits that can be corrected by the ECC circuit 30, the memory controller 20 detects a read error. When the memory controller 20 detects a read error, the memory controller 20 instructs the NAND memory 40 to change the read voltage value to a value shifted from the currently set value (for example, the initial value) based on the read voltage information 36 and execute a retry read operation. The memory controller 20 instructs the NAND memory 40 to execute the retry read operation until a read success is detected. When the retry read operation is executed, the latency (response time) of the read operation increases. Therefore, it is desirable that the memory controller 20 be able to know and set the appropriate read threshold voltage for the memory cells before receiving a read request from the host.

In some examples, the memory controller 20 does not have to instruct the NAND memory 40 of the read voltage value after the shift each time the read voltage value is shifted. The NAND memory 40 may store the currently set value of the read voltage, the memory controller 20 may notify the NAND memory 40 of the read voltage information 36, and the NAND memory 40 may then calculate the read voltage value to be used after the shift.

The CPU 28 is an example of a hardware processor. The CPU 28 controls the memory controller 20 by executing the firmware loaded in the RAM 24, for example. For example, the CPU 28 controls the data write operation, read operation, and erasing operation described below. A plurality of CPUs 28 may be provided for each operation.

The ECC circuit 30 encodes the data (also referred to as write data) to be written in a write operation of the NAND memory 40 for purposes of error correction. When the data (also referred to as read data) is read from the NAND memory 40 but contains an error, the ECC circuit 30 can correct the error in the read data based on the error correction code given to the data during the write operation.

The NAND controller 32 executes data transfer control between the RAM 24 and the NAND memory 40 under the control of the CPU 28. An example of the data transfer between the RAM 24 and the NAND memory 40 is Toggle DDR or ONFI (Open NAND Flash Interface).

The memory controller 20 and the NAND memory 40 can be connected by a plurality of channels, for example, two channels (Ch0 and Ch1). The number of channels may be just one or three and more. The NAND controller 32 controls the data transfer via the channels Ch0 and Ch1.

The NAND memory 40 includes for example, four memory chips 42a, 42b, 42c, and 42d. Two memory chips 42a and 42b are connected to the channel Ch0. Two memory chips 42c and 42d are connected to the channel Ch1. In other examples, three or more memory chips may be connected to each channel.

Figure 2:
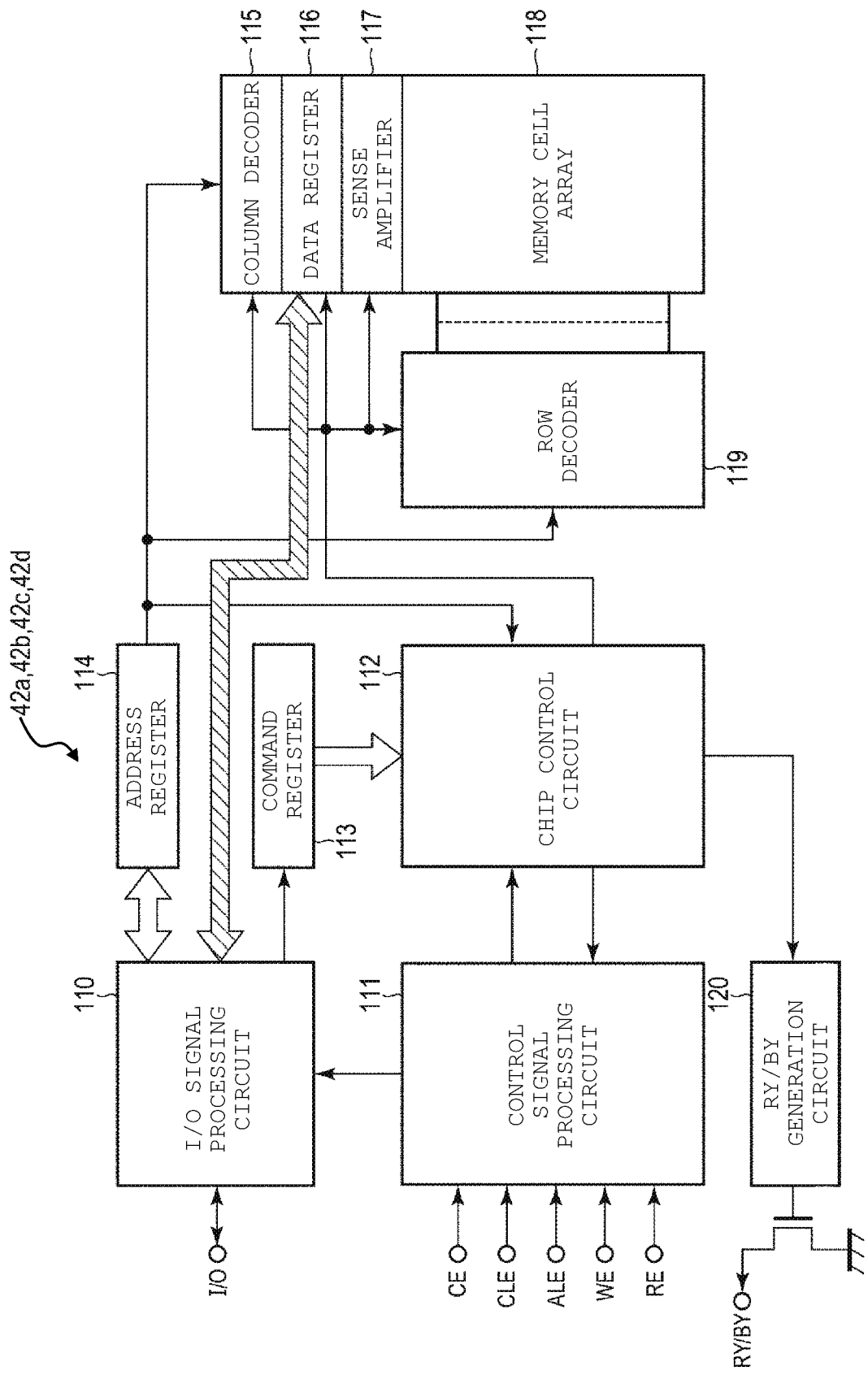
FIG. 2 is a block diagram of a memory chip provided in a memory system.

FIG. 2 is a block diagram showing an example of the memory chip 42a. The other memory chips 42b, 42c, and 42d are similarly configured and description of memory chip 42a may be taken as representative.

The memory chip 42a includes an input and output signal processing circuit 110 (I/O circuit 110), a control signal processing circuit 111, a chip control circuit 112, a command register 113, an address register 114, a ready and busy (RY/BY) circuit 120, a memory cell array 118, a column decoder 115, a data register 116, a sense amplifier 117, and a row decoder 119.

The channel Ch0 that connects the memory chip 42a and the NAND controller 32 includes an input and output (I/O) signal line, a control signal line, and a ready and busy (RY/BY) signal line. The I/O signal line is connected to the I/O signal processing circuit 110. The I/O signal line transmits data, addresses, various instructions, and various responses. The memory controller 20 transmits a read instruction, a write instruction, and an erase instruction to the memory chip 42a via the I/O signal line.

The control signal line includes therein a chip enable (CE) signal line, a command latch enable (CLE) signal line, an address latch enable (ALE) signal line, a write enable (WE) signal line, a read enable (RE) signal line, and the like. The control signal line is connected to the control signal processing circuit 111. The CE signal line transmits a signal indicating whether the target memory chip is being selected. The CLE signal line transmits a signal indicating that the signal transmitted on the I/O signal line is a command. The ALE signal line transmits a signal indicating that the signal transmitted on the I/O signal line is an address. The WE signal line transmits a signal for incorporating the data on the I/O signal line into the memory chip 42a. The RE signal line transmits a signal for outputting data from the memory chip 42a on the I/O signal line.

The RY/BY signal line is connected to the RY/BY generation circuit 120. The RY/BY signal line transmits a signal indicating whether or not the NAND memory 40 is present operating (busy). The signal transmitted by the RY/BY signal line indicates, for example, a ready state (RY) using a logic value H level and a busy state (BY) using a logic value L level.

The I/O signal processing circuit 110 is a buffer circuit for the transmitting and receiving of I/O signals between the memory controller 20 and the memory chip 42a. A command latched by the I/O signal processing circuit 110 is distributed and stored into the command register 113. An address that specifies the access destination latched by the I/O signal processing circuit 110 is distributed and stored into the address register 114. The data latched by the I/O signal processing circuit 110 is distributed and stored into the data register 116. The I/O signal processing circuit 110 can also receive data from the data register 116.

The address stored in the address register 114 includes a chip number, a row address, and a column address. The chip number is identification information for distinguishing the memory chip 42a from the other memory chips (e.g., memory chips 42b, 42c, 42d). The chip number, row address, and column address are read out by the chip control circuit 112, the row decoder 119, and the column decoder 115, respectively.

The control signal processing circuit 111 receives the control signal, and based on the received control signal, the I/O signal received by the I/O signal processing circuit 110 is distributed to a particular register as a storage destination. The control signal processing circuit 111 also transfers the received control signal to the chip control circuit 112.

The chip control circuit 112 shifts state based on the various control signals received via the control signal processing circuit 111. The chip control circuit 112 controls the operation of the memory chip 42a. The RY/BY generation circuit 120 shifts the state of the signal transmitted on the RY/BY signal line between the ready state (RY) and the busy state (BY) under the control of the chip control circuit 112.

The sense amplifier 117 senses the state of the memory cells MT (see FIG. 3) being read in the read operation and generates read data based on the sensed state. The sense amplifier 117 stores the generated read data into the data register 116. The read data stored in the data register 116 is sent to the I/O signal processing circuit 110 through the data line and is transmitted from the I/O signal processing circuit 110 to the memory controller 20.

The memory cell array 118 includes a plurality of memory cells MT and stores data therein. The memory cell array 118 includes a plurality of physical blocks BLK (see FIG. 3). Each physical block BLK includes a plurality of memory cells MT. The physical block BLK is the smallest unit size for a data erasure operation. That is, all the data stored in one physical block BLK is erased at once in the data erasure operation. In the following, these physical blocks are simply referred to as blocks.

Figure 3:
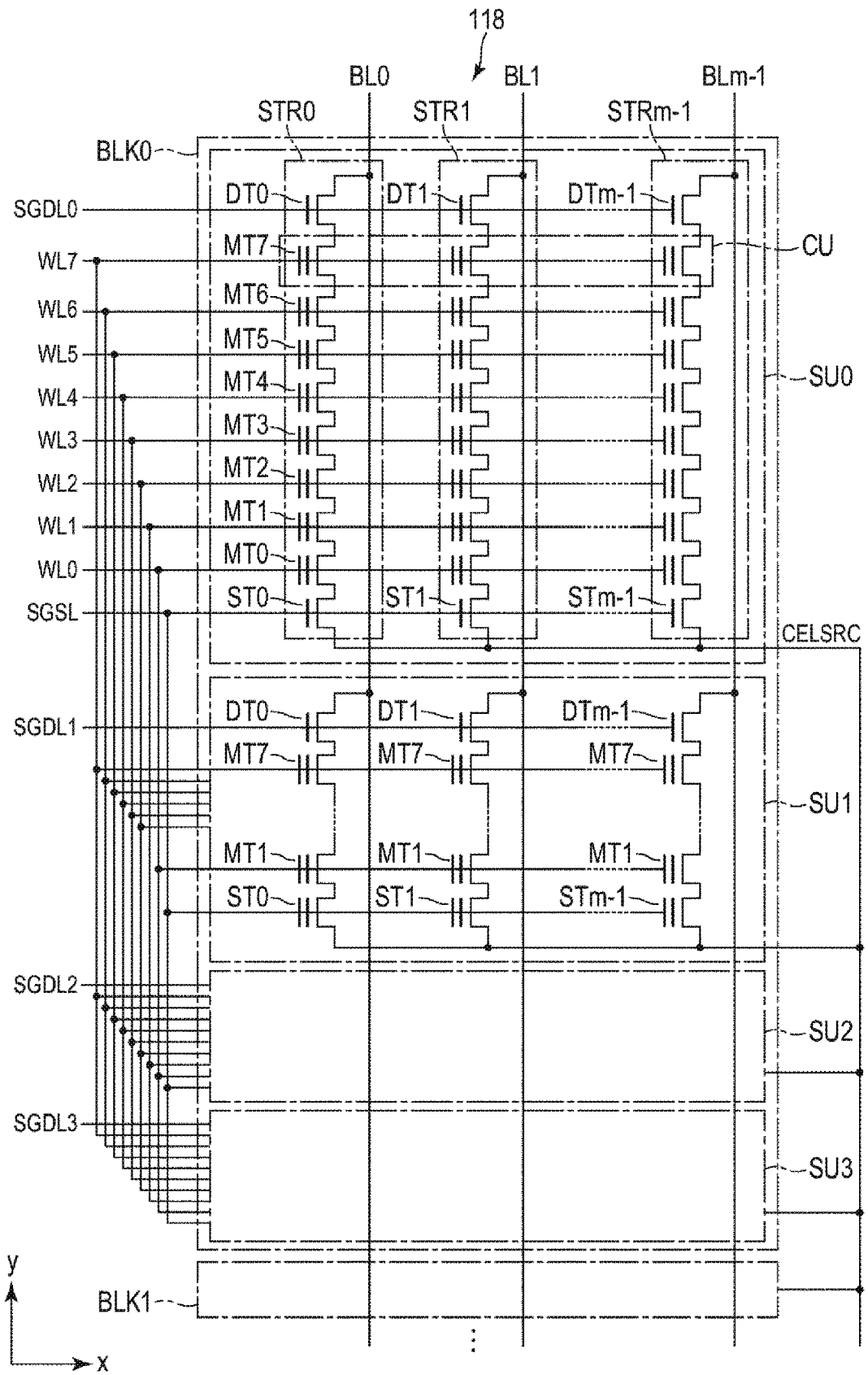
FIG. 3 is a circuit diagram of a memory cell array of a memory chip.

FIG. 3 is a circuit diagram showing an example of the memory cell array 118. The memory cell array 118 is, for example, a NAND memory having a so-called three-dimensional structure in which a plurality of memory cells MT are stacked in a three-dimensional manner. The memory cell array 118 includes a plurality of blocks BLK0, BLK1, . . . . For example, the memory cell array 118 includes hundreds to thousands of blocks BLK.

As shown in FIG. 3, a bit line (bit line BL0 to BLm−1, where m is an integer of two or more) is connected to a string STR (string STR0 to string STRm−1) in each block BLK0, BLK1, . . . . Each string STR includes a first select gate transistor ST (ST0 to STm−1), a plurality of memory cells MT (MT0 to MT7), and a second select gate transistor DT (DT0 to DTm−1) connected in series between a source line CELSRC and the corresponding bit line BL (BL0 . . . BLm−1). Each of the strings STR0 to STRm−1 in the same block BLK are connected to the same word lines WL. Groups of strings STR in the same block that are connected to the same second select gate line (drain side select gate line) SGDL are referred to as a string unit SU. Each string unit SU in each block is connected to the same first select gate line (source side select gate line) SGSL in this example. Each of the string units SU in the same block BLK are connected between a first select gate line (source side select gate line) SGSL and a respective one of the second select gate line (drain side select gate line) SGDL (SGDL0, SGDL1, SGDL2, SGDL3, in this example), but share the bit lines BL0 to BLm−1. Each block BLK includes for example, four string units SU0 to SU3.

Control gate electrodes of the first select gate transistors ST0 to STm−1 are connected to the first select gate line (source side select gate line) SGSL. The first select gate line SGSL is a signal line that controls the control gate electrodes of the first select gate transistors ST0 to STm−1. The first select gate transistors ST0 to STm−1 selectively connect the plurality of memory cells MT0 to MT7 and the source line CELSRC based on the voltage applied through the first select gate line SGSL. Four different first select gate lines SGSL may be connected to the string units SU0 to SU3, respectively.

Control gate electrodes of the second select gate transistors DT0 to DTm−1 are connected to the second select gate lines (drain side select gate lines) SGDL0 to SGDL3, respectively. The second select gate lines SGDL0 to SDGL3 are signal lines for controlling the control gate electrodes of the second select gate transistors DT0 to DTm−1, respectively. The second select gate transistors DT0 to DTm−1 selectively connect the plurality of memory cells MT0 to MT7 and the bit lines BL0 to BLm−1 based on the voltage applied through the second select gate lines SGDL0 to SGDL3, respectively.

Each memory cell MT can be configured as a MOSFET (Metal Oxide Semiconductor Field Effect Transistor) having a stacked gate structure. The stacked gate structure includes, for example, a floating gate formed with a tunnel oxide film interposed therebetween and a control gate electrode formed above the floating gate with a gate insulating film interposed therebetween. The threshold voltage of the memory cell MT changes according to the number of charges stored in the floating gate. In the memory cell MT, a positive charge is injected into the floating gate at the time of writing, and a positive charge is extracted from the floating gate at the time of erasing. Each memory cell MT may be written with any one of at least two different data values. Each memory cell MT non-volatilely stores a data value according to differences in the threshold voltage of the transistor.

In each block BLK, the control gate electrodes of the memory cells MT0 to MT7 are connected to the corresponding word lines WL0 to WL7. Each of the word lines WL0 to WL7 is a control signal line for selecting a row of memory cells MT located in the X direction in the memory cell array 118. Each of the word lines WL0 to WL7 is commonly connected to one group of memory cells MT arranged in a row. The memory cells MT0 to MT7 are provided at the intersections of the word lines WL0 to WL7 and the bit lines BL0 to BLm−1, respectively. Reading or writing of the memory cell MT requires applying a read voltage or a write voltage to the word line WL (hereinafter, also referred to as a selected word line WL) connected to the memory cell MT on which the reading or writing is performed.

In each block BLK, the word lines WL0 to WL7 corresponding to the same address are commonly connected to the memory cells MT0 to MT7 of each of the four string units SU0 to SU3. A set of memory cells MT sharing a word line WL is referred to as a cell unit CU. Data is collectively written and collectively read out to and from the memory cells MT provided in the same cell unit CU. The storage space of one cell unit CU contains one or more pages.

In the memory system 12, each memory cell MT may be able to store multiple bits. For example, when each memory cell MT can store a value of a plurality of bits, for example, n bits, the storage capacity per word line WL (cell unit CU) is equal to the size of n pages, where n is an integer of 2 or more. For example, when each memory cell MT operates in a triple level cell (TLC) mode a 3-bit value can be stored. The operation mode in which each memory cell MT stores a 2-bit value is called a multi-level cell (MLC) mode, and the operation mode in which each memory cell MT stores a 4-bit value is called a quad-level cell (QLC) mode. The present disclosure is also applicable to the MLC mode, the QLC mode, or other modes in which each memory cell MT stores a value of a plurality of bits.

In the TLC mode, data for 3 pages can be stored in each cell unit CU. Of the three pages of one cell unit CU, the page to be written first is called the lower page, the page to be written after the lower page is called the middle page, and the page to be written after the middle page is called the upper page. In addition, there may be a mode in which the cell programming (that is, writing) is executed collectively for a part or all pages of the plurality of pages configured with one cell unit CU.

Figure 4:
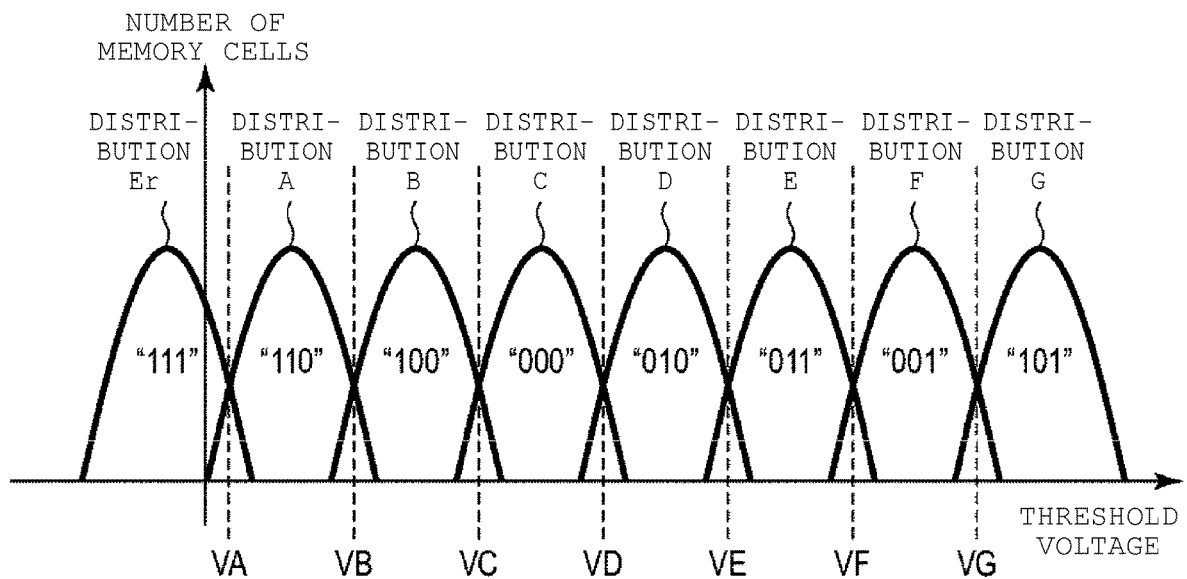
FIG. 4 is a diagram depicting the distribution of threshold voltages of memory cells operating in a TLC mode.

FIG. 4 is a diagram showing an example of the distribution of the threshold voltage of the memory cell MT operating in the TLC mode. In FIG. 4, the horizontal axis represents the threshold voltage of the memory cell MT, and the vertical axis represents the number of memory cells MT indicating a certain bit value (data value). When each memory cell MT operates in the TLC mode, the threshold voltage of the memory cells MT will be in eight distributions (groups) including distribution Er, distribution A, distribution B, distribution C, distribution D, distribution E, distribution F, and distribution G as shown in FIG. 4.

According to the TLC mode, each memory cell MT can store the octal value data xyz defined by the data x belonging to the upper page, the data y belonging to the middle page, and the data z belonging to the lower page. The values of data x, data y, and data z are "0" or "1".

The threshold voltage of each memory cell MT is set (written or programmed) to belong to any of eight distributions (distribution Er, distribution A, distribution B, distribution C, distribution D, distribution E, distribution F, and distribution G). The correspondence between each particular distribution and the data value of the corresponding octal value data xyz is set in advance. For example, the data value "111" is assigned to the distribution Er. A data value "110" is assigned to the distribution A. Each data value shown in FIG. 4 is assigned to the distributions B to G. The correspondence between each distribution and the data value is not limited to the above and other encodings may be adopted.

The row decoder 119, the column decoder 115, the data register 116, and the sense amplifier 117 of the NAND memory 40 will be described with reference to FIG. 2. The row decoder 119, the column decoder 115, the data register 116, and the sense amplifier 117 are a part of peripheral circuits for the memory cell array 118. The peripheral circuits perform read, write, and erase operations on the memory cell array 118 under control by the chip control circuit 112.

For example, in the write operation, the column decoder 115 selects and activates the bit line BL corresponding to the column address. The sense amplifier 117 sets the potential of the bit line BL selected by the column decoder 115 to 0 volt. The row decoder 119 applies a programming pulse to the word line WL selected corresponding to the row address. As a result, charges are injected into the floating gate of the memory cell MT located at the intersection of the selected bit line BL and the selected word line WL, and as a result, the threshold voltage of the floating gate rises. The sense amplifier 117 checks whether the threshold voltage of the memory cell MT to be written has reached the voltage corresponding to the data stored in the data register 116 after application of the programming pulse. According to the check result by the sense amplifier 117, the row decoder 119 may increase the programming pulse and apply the increased programming pulse. Such a cycle of programming pulse application, threshold checking, and programming pulse increase may be performed until the threshold voltage of the memory cell MT reaches the voltage corresponding to the data value to be written.

In a read operation, the sense amplifier 117 precharges the power potential Vcc to the bit line BL. The row decoder 119 sequentially applies different read voltages for identifying the distribution of each of the data values "111", "110", "100", "000", "010", "011", "001", and "101" on the selected word line WL. The row decoder 119 applies a voltage of a transfer potential to the non-selected word line WL to keep the memory cell MT belonging to the non-selected word line WL in a conductive state. The sense amplifier 117 determines the data value stored in the target memory cell MT by detecting which read voltage is applied when the charge stored by the precharge flows out to the source line CELSRC.

For example, as shown in FIG. 4, when the value of the read voltage is the voltage VA between the distribution Er and the distribution A, it is determined that the memory cell MT having a threshold voltage lower than the read voltage VA is within the distribution Er. When the value of the read voltage is the voltage VB between the distribution A and the distribution B, it is determined that the memory cell MT having a threshold voltage lower than the read voltage VB is within either the distribution Er or the distribution A. Similarly, as shown in FIG. 4, when the value of the read voltage is the voltage of two adjacent distributions, it is determined that the memory cell MT having a threshold voltage lower than the read voltage is within the distribution having the lower threshold voltage between the two distributions. In the following, when the separate read voltages VA to VG are not being distinguished from one another, they are simply collectively referred to as a read voltage V.

The threshold voltage of a memory cell changes due to the influence of stress such as program disturb, read disturb, or data retention age. When the threshold voltage changes, the appropriate value for the read voltage also changes. Therefore, it may not always be possible to read a memory cell value using a default read voltage set according to a default threshold voltage distribution. The memory controller 20 manages a default value (also referred to as an initial value) of the read voltage (specifically, stores the default value into the RAM 24) and also manages a shift value indicating how much the appropriate read voltage deviates from the default value.

The shift value may be managed by block. Within the same block, the shift value may differ for each word line in the block, but typically the deviation of the shift value for each word line in the same block may be corrected by a statistical method. Therefore, the shift value is preferably managed for each block. The shift values for each block are provided in the read voltage information 36.

Since there are seven read voltages in a TLC mode NAND memory, if the shift value of each read voltage is expressed in 1 byte, the shift values per block will be 7 bytes. One memory chip may include thousands of blocks. Moreover, the NAND memory 40 may include a large number of memory chips. Therefore, the shift values for the read voltage of all the blocks in the NAND memory 40 may correspond to a relatively large amount of information.

In order to reduce the memory size required for storing the shift values, it is conceivable to determine a limited number of shift patterns in advance and store the identification information for the predetermined shift patterns instead of storing the shift values themselves. The shift pattern is a combination of seven shift values. The limited number of predetermined shift patterns are stored as a shift table with identification information (index) attached to each. Each shift pattern is determined based on the estimation result of the threshold voltage. The threshold voltage is estimated based on an error in the read data when reading at a certain read voltage (ratio of the ratio of erroneously reading "0" to "1" and the ratio of erroneously reading "1" to "0"). For example, when the ratio of erroneously reading "0" to "1" is larger than the ratio of erroneously reading "1" to "0", it may be estimated that the threshold voltage is shifted in the negative direction. The shift amount is expressed in units (DAC) of a D/A converter that converts a shift value into an analog voltage. It is required that the read voltage is similarly shifted according to the shift of the threshold voltage. The shift value when stress such as program disturb, read disturb, or data retention is applied to the NAND memory 40 is obtained and registered in the shift table.

For example, assuming that the total number of shift patterns is 256, the shift patterns can be specified by an 8-bit (that is, 1-byte) index. Therefore, when storing the shift value itself, a memory size of 7 bytes per block is required, but by storing the indexes of 256 shift patterns, the memory size per block is reduced to 1 byte.

The number of blocks of the NAND memory 40 increases with the increasing demand for storage capacity. For example, when the NAND memory includes eight memory chips and one memory chip contains 3328 blocks, the memory size for storing the index of the shift pattern is about 26 KB (=8×3328×1). This memory size is large for embedded systems where a low-cost design is required. As the number of blocks per memory chip increases, a management method for further reducing the size of the memory for storing the index of the shift pattern is desired.

Figure 5:
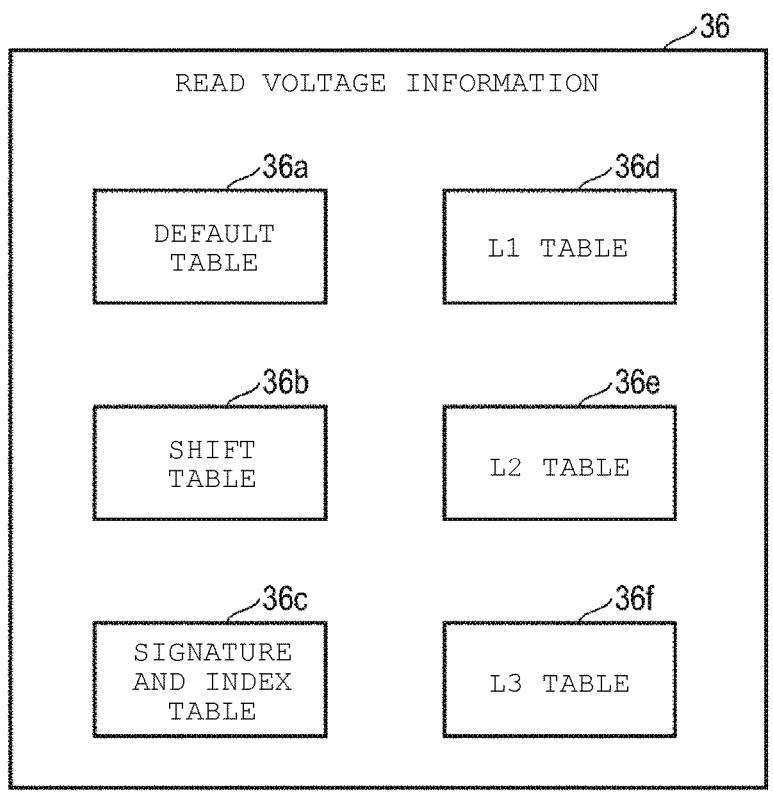
FIG. 5 is a diagram of stored read voltage information.

In the present embodiment, by managing the index of the shift pattern in multiple stages, the total data size of the read voltage information 36 can be reduced and the read voltage information 36 can be efficiently stored in a small memory size. FIG. 5 shows an example of the read voltage information 36 stored in the RAM 24. Three-stage management will be described as an example of multi-stage management, but the number of stages is not limited thereto. The read voltage information 36 includes a default table 36a, a shift table 36b, a signature and index table 36c, the first-stage index management information 36d (L1 table 36d), the second-stage index management information 36e (L2 table 36e), and the third-stage index management information 36f (L3 table 36f).

FIG. 6 shows an example of the default table 36a. The default table 36a stores a value that can be set as an initial value of the read voltage. When the memory cell operates in the TLC mode, the default table stores the initial values VA0 to VG0 of each of the seven read voltages VA to VG shown in FIG. 4.

The memory controller 20 sets the value of the read voltage to the initial value and performs a read operation. The read operation using the read voltage of the initial value is called a normal read operation. If the error correction fails in the normal read operation (that is, if a read error is detected), the memory controller 20 acquires a shift value of the read voltage by reference to the shift table 36b. The memory controller 20 performs a read operation using the acquired shift value. The read operation using the shift value of the read voltage is referred to as a retry read operation or a shift read operation. When the error correction fails in the shift read operation, the memory controller 20 acquires another shift value of the read voltage by reference to the shift table 36b again and performs a shift read operation using the acquired other shift value.

FIG. 7 shows an example of the shift table 36b. The shift table 36b stores a predetermined number (here, 256) of shift patterns. The shift pattern includes shift values that indicate the amount of shift from the initial values of the respective read voltages VA to VG, the shift values being Shift [A], Shift [B], Shift [C], Shift [D], Shift [E], Shift [F], and Shift [G]. The identification information of the shift pattern is called an index. For example, 256 shift patterns can be specified by an 8-bit index. In FIG. 7, the index and shift value are represented by decimal numbers.

For example, in the shift pattern of index 0, all shift values are 0, and the read voltage is an initial value. For example, the shift pattern of index 1 is Shift [A] with a value of 0, Shift [B] with a value of 1, Shift [C] and Shift [D] with a value of −1, and Shift [E], Shift [F], and Shift [G] with a value of 0. For example, the shift pattern of the index 255 is Shift [A] with a value of 2, Shift [B] with a value of −5, Shift [C] with a value of −7, Shift [D] with a value of −10, Shift [E] with a value of −12, Shift [F] with a value of −14, and Shift [G] with a value of −17. The set of shift values Shift [A], Shift [B], Shift [C], Shift [D], Shift [E], Shift [F], and Shift [G] provided in each of the 256 indexes 0 to 255 is different from each other.

FIG. 8 shows an example of the L1 table 36d. FIG. 9 shows an example of the L2 table 36e. FIG. 10 shows an example of the L3 table 36f. FIG. 11 shows an example of the signature and index table 36c.

As shown in FIG. 8, the L1 table 36d stores a 1-bit L2 flag regarding the read voltage for each block of the NAND memory 40. Therefore, the memory size for storing the L1 table 36d is the number of blocks×1 bit. The L2 flag contains information that can identify whether a plurality of bits of data could be read from each block when the read voltage was set to the initial value, that is, whether the read (normal read) was successful or unsuccessful. The L2 flag having a value of "0" is information that can identify that the normal read of the corresponding block was successful. The L2 flag having a value of "1" is information that can identify that the normal read of the corresponding block failed and the shift read was successful. In other words, the block having an L2 flag of "0" is assumed to be a block in which data can be read by normal read. A block having an L2 flag of "1" is assumed to be a block in which data cannot be read by normal read and shift read is required.

When the normal read is performed, the memory controller 20 sets the value of the L2 flag of the block in which the read is successful to "0", and sets the value of the L2 flag of the block in which the read is unsuccessful to "1". The memory controller 20 updates the L1 table 36d so that the value of the L2 flag of the block is returned to "0" when the read is successful after erasing and programming the block in which the read has failed.

The L1 table 36d does not store the block address that uniquely identifies all the blocks of the NAND memory 40. However, if the L2 flag is stored in the entry of the L1 table 36d in the order of the block address, the memory controller 20 can know the address of the block in which the normal read has failed, according to the entry in which the L2 flag having the value "1" is stored. For example, if the L1 table 36d stores "00001010 . . . ", the memory controller 20 can determine that the normal read fails and a shift read is required in the blocks at the fifth and seventh addresses from the beginning. The L1 table 36d stores the L2 flag indicating whether shift read is necessary but does not store the index of the shift pattern for shift read, so that the total data size can be reduced. The L2 table 36e and the L3 table 36f having a certain data size are prepared as storage areas for the indexes of shift patterns for blocks that require shift read.

As shown in FIG. 9, the L2 table 36e stores a 3-bit signature regarding the index of the shift pattern for the block in which the value of the L2 flag is "1" in the L1 table 36d. The signature is stored in the entry of the L2 table 36e in the order of the blocks in which the value of the L2 flag is "1" in the L1 table 36d. The 3-bit signature can indicate the index of up to 8 shift patterns out of 256 shift patterns represented by 8-bit indexes. The signature is a code obtained by reversible transformation from the index of the shift table 36b.

The number of entries in the L2 table 36e corresponds to the number of blocks. The number of entries in the L2 table 36e is determined according to the probability (or number, frequency) of failure of the normal read. The size of the memory for storing the L2 table 36e is smaller than the size of the memory for storing the L1 table 36d.

The L2 table 36e also does not store the block address. However, since the signature corresponds to the block in which the value of the L2 flag is "1" in the L1 table 36d, the memory controller 20 can know the address of the block corresponding to the signature according to the number of the L2 flag the signature corresponds to.

The L2 table 36e may not be able to store the indexes of all shift patterns for blocks that require shift read. As shown in FIG. 10, the L3 table 36f stores the block address and the index of the shift pattern for each block to which the shift pattern whose 3-bit signature cannot be represented is applied. In FIG. 10, the block address and the index are represented by decimal numbers. It is assumed that the block address is 16 bits. The index is assumed to be 8 bits.

The number of entries in the L3 table 36f is less than the number of entries in the L2 table 36e. The size of the memory for storing the L3 table 36f is smaller than the size of the memory for storing the L2 table 36e.

As shown in FIG. 11, the signature and index table 36c stores the correspondence between the signature stored in the L2 table 36e and the index. The correspondence between signatures and indexes can be updated. Seven indexes are assigned to each of the seven signatures. Specific information, such as None, is assigned to the remaining one signature, in this case, signature "111". The specific information means that a single or a plurality of unspecified indexes other than these seven indexes are assigned to the signature "111", and the detailed information of None may be an indefinite value. That is, the L3 table 36f stores the block address of the block in which the L2 table 36e stores the signature "111" and the index of the shift pattern of the block.

FIG. 11 shows that when a new index (here, index 35) is added to the signature and index table 36c1 on the left side, the signature and index table 36c1 is updated to the signature and index table 36c2 on the right side. In the signature and index table 36c1, seven shift pattern indexes 138, 139, 155, . . . 187, and 195 out of 256 shift pattern indexes are respectively assigned to seven signatures "000" to "110" by the Least Recently Used (LRU) method. In this state, if a new index 35 is added, the oldest index 195 is expelled to obtain the updated signature and index table 36c2. In the signature and index table 36c2, seven shift pattern indexes 35, 138, 139, 155, . . . 187 out of 256 shift pattern indexes are respectively assigned to seven signatures "000" to "110" by the Least Recently Used (LRU) method.

Figure 12:
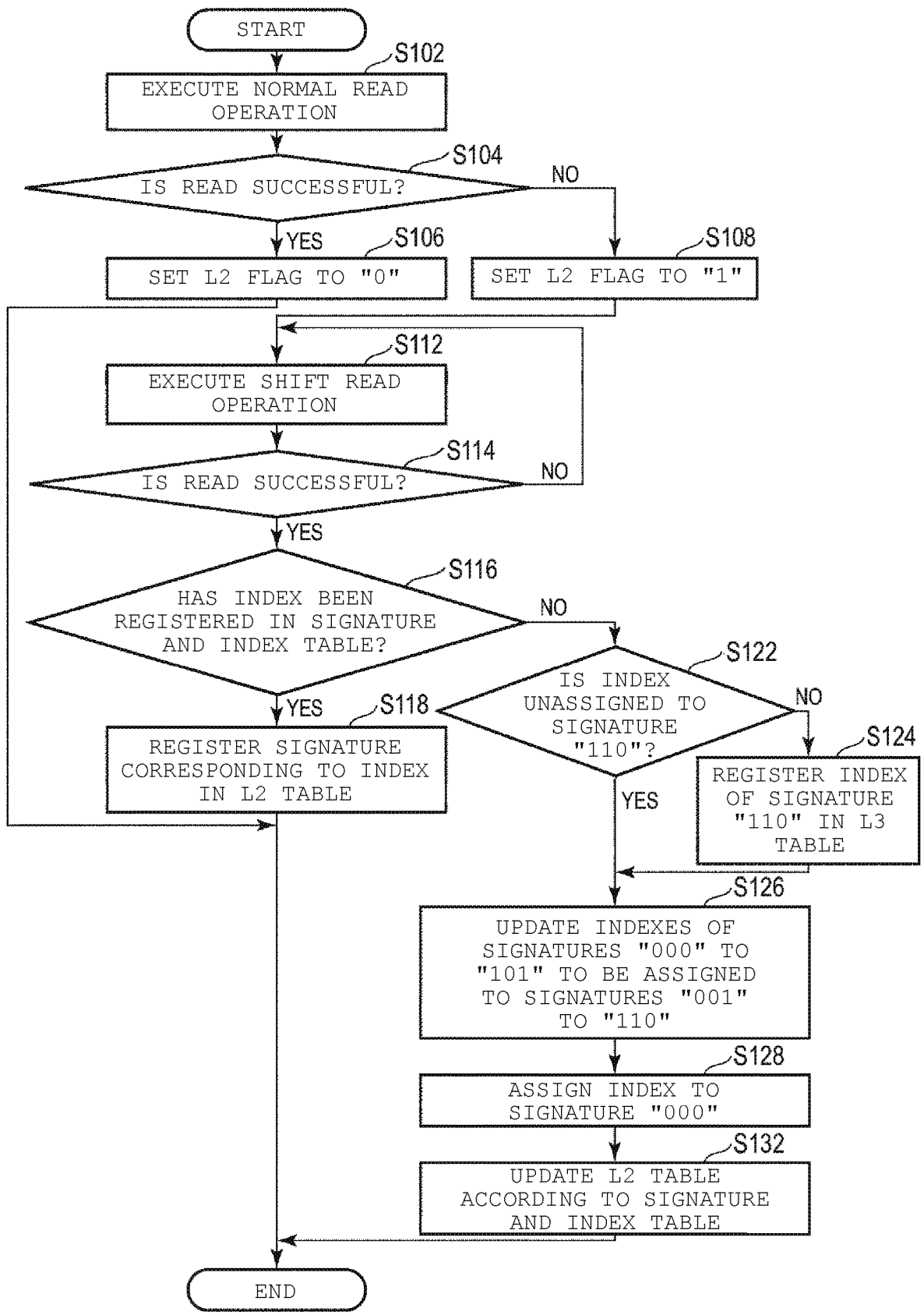
FIG. 12 is a flowchart of processing of a memory controller.

FIG. 12 is a flowchart showing an example of processing of the memory controller 20 regarding creation and update of the L1 table 36d, the L2 table 36e, the L3 table 36f, and the signature and index table 36c. The memory controller 20 executes this processing during a period during which the read operation, the write operation, and the erasing operation are not performed. The read operation, the write operation, and the erasing operation may be performed by an instruction from the host 14, or a garbage collection (compaction) operation, a refresh operation, a patrol operation, and the like.

In S102, the memory controller 20 executes a normal read operation for a certain block (hereinafter, referred to as a target block).

In S104, the memory controller 20 determines whether the normal read is successful.

If the normal read is successful (YES in S104), in S106, the memory controller 20 sets the L2 flag related to the target block in the L1 table 36d to "0" and ends the process. When the initial value of the L2 flag is "0", S106 can be omitted.

If the normal read fails (NO in S104), in S108, the memory controller 20 sets the L2 flag related to the target block in the L1 table 36d to "1".

In S112, the memory controller 20 executes a shift read operation as a retry read operation for the target block. At the time of the shift read operation, the memory controller 20 reads the shift pattern of the index next to the index of the currently set shift pattern from the shift table 36b and shifts the read voltage according to the read shift pattern. For example, the index 0 is set during the normal read operation and the memory controller 20 reads the shift pattern of the index 1 during the first re-shift read operation and shifts the read voltage according to the shift pattern of the index 1.

In S114, the memory controller 20 determines whether the shift read is successful.

If the shift read fails (NO in S114), the memory controller 20 repeats the shift read operation in S112. That is, the memory controller 20 increases the index of the shift pattern by 1, further shifts the read voltage, and repeats the read operation.

If the shift read is successful (YES in S114), in S116, the memory controller 20 determines whether the index of the shift pattern used in the successful shift read (index 35 in FIG. 11) is registered in the signature and index table 36c.

When the index is registered in the signature and index table 36c (YES in S116), in S118, the memory controller 20 registers the signature corresponding to the index in the entry corresponding to the target block in the L2 table 36e and ends the process.

When the index is not registered in the signature and index table 36c (NO in S116), in S122, the memory controller 20 determines whether the index is unassigned to the signature "110" in the signature and index table 36c.

When the index is not unassigned to the signature "110", that is, the index is assigned (NO in S122), in S124, the memory controller 20 registers the index which has been assigned to the signature "110" (index 195 in the case of FIG. 11) in the L3 table 36f together with the target block address.

If the index is unassigned to the signature "110" (YES in S122), or after S124, in S126, the memory controller 20 reassigns the indexes which have been assigned to signatures "000" to "101" (in the case of FIG. 11, indexes 138 to 187) to signatures "001" to "110".

In S128, the memory controller 20 assigns the index used in the successful shift read (index 35 in FIG. 11) to the signature "000" in the signature and index table 36c. As a result, the signature and index table 36c is updated as shown in FIG. 11.

In S132, the memory controller 20 rewrites the signature of the L2 table 36e according to the updated signature and index table 36c. That is, the signatures "000" to "101" representing the indexes 138 to 187 are newly rewritten to the signatures "001" to "110" representing the indexes 138 to 187, respectively.

Figure 13:
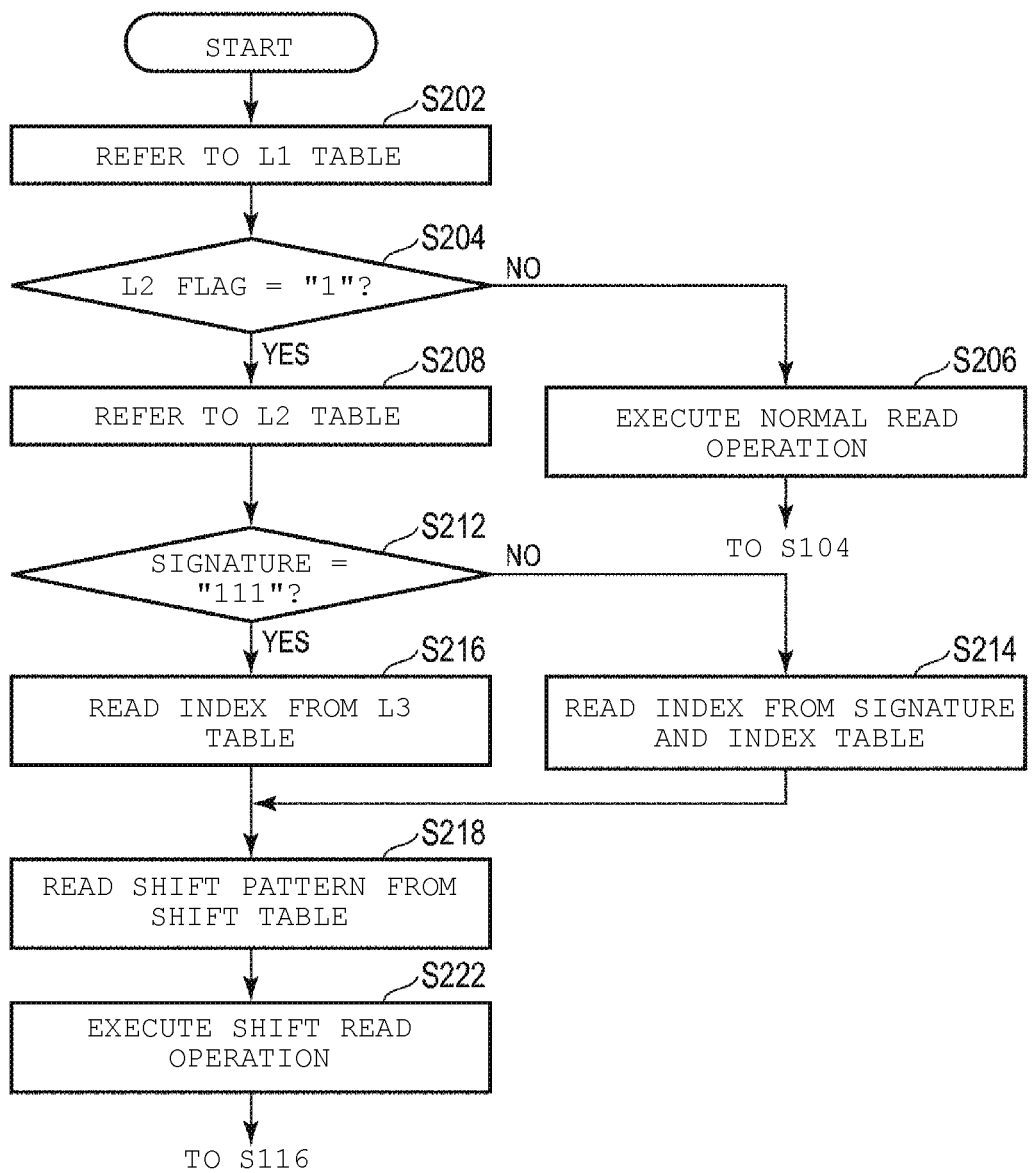
FIG. 13 is a flowchart of processing of a memory controller during a read operation initiated by a host.

FIG. 13 is a flowchart showing an example of the processing flow of the memory controller 20 regarding the read operation. The read operation includes a read operation by the host 10 and a voluntary read operation provided in a garbage collection operation, a refresh operation, a patrol operation, and the like.

In S202, the memory controller 20 refers to the L1 table 36d.

In S204, the memory controller 20 determines whether the value of the L2 flag related to the block to be read is "1".

When the value of the L2 flag is not "1", that is, "0" (NO in S204), in S206, the memory controller 20 executes a normal read operation. The process of S206 corresponds to the process of S102 shown in FIG. 12. Therefore, the memory controller 20 executes the processes after S104 in FIG. 12 after executing the normal read operation.

When the value of the L2 flag is "1" (YES in S204), in S208, the memory controller 20 refers to the L2 table 36e. In S212, the memory controller 20 determines whether the signature of the entry corresponding to the read target block is "111"

When the signature is not "111" (NO in S212), in S214, the memory controller 20 reads the index corresponding to the signature from the signature and index table 36c.

When the signature is "111" (YES in S212), in S216, the memory controller 20 reads the index of the read target block from the L3 table 36f.

After S214 or S216, in S218, the memory controller 20 reads the shift pattern indicated by the index from the shift table 36b.

In S222, the memory controller 20 performs a shift read operation by changing the value of the read voltage from the initial value according to the shift pattern. The process of S222 corresponds to the process of S112 shown in FIG. 12. Therefore, the memory controller 20 executes the processes after S114 in FIG. 12 after executing the shift read operation.

As described above, in the embodiment, the L1 table 36d stores information that can identify whether the normal read regarding the memory block succeeds or fails with one bit of information per block for all the blocks, and the L2 table 36e stores a 3-bit signature indicating an index that can identify the shift pattern for the block in which the normal read has failed. The number of shift pattern indexes (that is, the type of shift pattern) used for all blocks of the NAND memory 40 during shift read is large, and there may be a case where the L3 table 36f cannot store the indexes of all shift patterns to be used with the 3-bit signature. In this case, the L3 table 36f stores the index of the 8-bit shift pattern per block for the blocks that the L2 table 36e cannot store. As a result, the size of the memory that stores the index of the shift pattern of the NAND memory 40 can be reduced.

FIG. 14 is a diagram illustrating the size of the memory that stores the index of the shift pattern.

When it is assumed that the probability of a successful normal read is 70%, the L2 flag having a value of "0" is 70% in the L1 table 36d and the L2 flag having a value of "1" is 30%. The read voltage of 70% of all blocks can be stored by the default table 36a and the L1 table 36d (L2 flag having a value of "0"). That is, the hit rate of the L1 table 36d is 70%. The index of the shift pattern of the remaining 30% of the blocks needs to refer to at least L2 table 36e.

When it is assumed that the index of the shift pattern of 80% blocks of the remaining 30% blocks is the index corresponding to seven signatures (that is, the hit rate of the L2 table 36e is 80%), the number of blocks to be prepared in the L2 table 36e is 24% (=30×80%) of the total number of blocks.

The L2 table 36e cannot store the index of the shift pattern (index corresponding to the signature "111") of 20% blocks of the blocks for which the normal read has failed. The index of the shift pattern of these blocks is stored into the L3 table 36f. Therefore, the number of blocks to be prepared in the L3 table 36f is 6% (=30×20%) of the total number of blocks.

Assuming that the NAND memory 40 includes eight memory chips and the memory chip includes 3328 blocks, the total data size of the shift pattern index is as follows:

(1 bit+3 bits×0.3+(16 bits+8 bits)×0.3×0.2)×3328×8

=(1 bit+0.9 bits+1.44 bits)×3328×8

=88,924.16 bits

=11115.52 bytes

≅11.2 KB

When storing the raw data of the shift pattern index with 1 byte per block, the memory size needs to be about 26 KB. According to the present embodiment, the total data size of the shift pattern index is about 11 KB, and the size of the memory for storing the shift pattern index can be reduced to less than half as compared with the related art.

Second Embodiment

In the first embodiment, the shift table 36b stores a first number of shift patterns, for example, 255 shift patterns, but not all shift patterns are used in the shift read. The shift patterns used in the shift read may be a second number that is less than the first number. FIG. 15A shows an example of the index of the shift pattern used in the shift read at the time (immediately after) when the memory cell is programmed. FIG. 15B shows an example of the index of the shift pattern used in the shift read after the lapse of a first time after the memory cell is programmed. FIG. 15C shows an example of the index of the shift pattern used in the shift read after the lapse of a second time after the memory cell is programmed. FIG. 15D shows an example of the index of the shift pattern used in the shift read after the lapse of a third time after the memory cell is programmed. The second time is longer than the first time and the third time is longer than the second time. Here, the total number of shift-read blocks is 32.

For example, in the shift read immediately after the program (FIG. 15A), half of the 32 blocks, 16 blocks, can be read at the read voltage of the shift pattern corresponding to the index 127. In the shift read after the lapse of the third time from the program (FIG. 15D), 12 blocks out of 32 blocks can be read at the read voltage of the shift pattern corresponding to the index 138.

In the second embodiment, the index is represented by a code having a bit number shorter than the signature by utilizing such a bias in the use of the shift pattern, and the L3 table 36f for storing the raw data of the index is not required.

The configuration of a memory system 12a is substantially the same as the configuration of the memory system 12 shown in FIG. 1. The second embodiment is different from the first embodiment in that the RAM 24 stores read voltage information 136 instead of the read voltage information 36.

Figure 16:
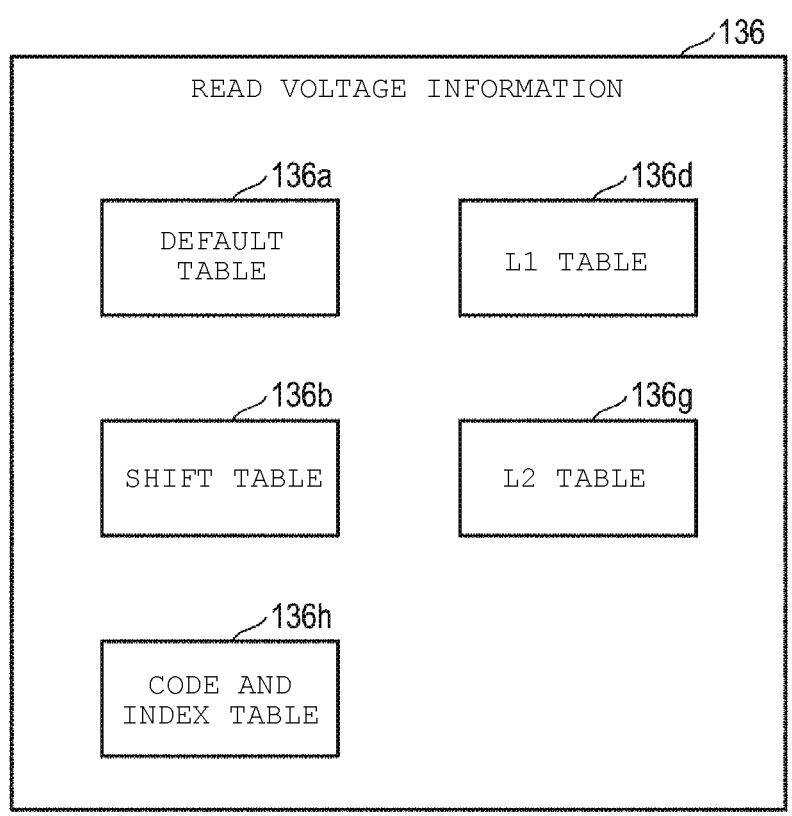
FIG. 16 is a diagram showing an example of read voltage information of a second embodiment.

FIG. 16 shows an example of the read voltage information 136. The read voltage information 136 includes a default table 136a, a shift table 136b, an L1 table 136d, an L2 table 136g, and a code and index table 136h. The default table 136a, the shift table 136b, and the L1 table 136d correspond to the default table 36a, the shift table 36b, and the L1 table 36d of the first embodiment, respectively.

FIG. 17A shows an example of the L1 table 136d and FIG. 17B shows an example of the L2 table 136g. As shown in the upper table portion of FIG. 17A, the L1 table 136d stores the L2 flag indicating whether the normal read was successful or unsuccessful for all the blocks of the NAND memory 40. The configuration of the L1 table 136d is the same as that of the L1 table 36d of the first embodiment. The memory controller 20 encodes a series of shift pattern indexes (lower table FIG. 17A) for the blocks in which the value of the L2 flag is "1". When the index is encoded by utilizing the continuity or bias of the index generation of the shift pattern, the index can be encoded with a very small number of bits. Examples of coding are Huffman coding, Shannon-Fano coding, and run-length encoding.

The memory controller 20 registers the code obtained by encoding the sequence (lower table shown in FIG. 17A) in the L2 table 136g. If the index series of the shift pattern of the block in which the normal read failed and the shift read succeeded is 127, 127, 127, 156, 127, 127, . . . , the obtained codes becomes as shown in FIG. 17B.

FIG. 18 shows an example of the code and index table 136h. The code and index table 136h shows an example of the correspondence between the code and the index. The code "αi" indicates that the index α is continuous i times in the index series of the shift pattern relating to the block in which the value of the L2 flag is "1". That is, the codes A3, B1, A3, . . . show that in the index series of the shift pattern relating to the block in which the value of the L2 flag is "1", the index 127 continues three times, the index 156 appears only once, and the index 127 continues three times, etc. Therefore, the memory controller 20 can obtain the series shown in FIG. 17A (lower table portion) by decoding the code obtained from the code and index table 136h.

Therefore, the read voltage information 136 according to the second embodiment does not require the L3 table 36f according to the first embodiment that stores the raw data of the index of the shift pattern. Furthermore, since the L2 table 136g according to the second embodiment stores the code of the index series, the size can be made smaller than that of the L2 table 36e according to the first embodiment that stores the signature indicating each index.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
    a non-volatile memory with memory cells for storing multiple bit data; and
    a controller configured to apply read voltages to the non-volatile memory at different threshold levels to read data written to the memory cells, wherein
    the non-volatile memory comprises sub-groups of memory cells each sub-group including a plurality of memory cells, and
    the controller is configured to store:
        first information indicating a first initial value for each different threshold level of the read voltages,
        second information that indicates whether data can be successfully read from each sub-group when the respective different threshold levels of the read voltages are set to the first initial values, and
        third information that indicates a second initial value for each different threshold level of the read voltages for at least one sub-group for which data reading was unsuccessful when a read voltage was set to the first initial value.

2. The memory system according to claim 1, wherein the third information includes:
    first identification information indicating a first shift pattern among a plurality of shift patterns each including a combination of shift values for the different threshold levels of the read voltages, and
    second identification information indicating a second shift pattern among the plurality of shift patterns.

3. The memory system according to claim 2, wherein the bit size of the first identification information is less than the bit size of the second identification information.

4. The memory system according to claim 1, wherein
    the second information includes 1-bit information about each of the sub-groups, and
    a total data size of the third information is less than a total data size of the second information.

5. The memory system according to claim 1, wherein the third information includes a code obtained by encoding identification information for a plurality of shift patterns.

6. The memory system according to claim 5, wherein the encoding is one of Huffman coding, Shannon-Fano coding, and run-length encoding.

7. The memory system according to claim 1, wherein the non-volatile memory is NAND flash memory.

8. A memory system, comprising:
    a memory chip including a plurality of memory cells for storing multi-bit data according to a plurality of threshold voltage levels;

a memory controller configured to apply a plurality of read voltages to each of a plurality of subsets of the plurality of memory cells, the plurality of read voltages corresponding to the plurality of threshold voltage levels, wherein the memory controller is configured to store:
- a default value table indicating a first initial value for each reading voltage level corresponding to the plurality of threshold voltage levels,
- a read success flag table that identifies for each subset of the plurality of memory cells whether a previous reading using the first initial values for each reading voltage level was successful or not, and
- a first shift table including shift information indicating a second initial value for each reading voltage level corresponding to the plurality of threshold voltage levels to be used on each subset for which the previous reading using the first initial values was not successful.

9. The memory system according to claim 8, wherein the shift information is a 3-bit signature value indicating one or more predetermined shift patterns for the read voltages.

10. The memory system according to claim 9, wherein the read success flag table includes multiple 1-bit data values in a predetermined order corresponding to an identifying order of the subsets.

11. The memory system according to claim 9, wherein the memory controller is configured to store a shift pattern table of the predetermined shift patterns for the read voltages.

12. The memory system according to claim 8, wherein the subsets are each a memory block.

13. The memory system according to claim 8, wherein the plurality of memory cells are NAND flash memory cells.

14. The memory system according to claim 8, wherein the memory cells are triple level cells.

15. A memory system data reading method for a non-volatile memory with memory cells for storing multiple bit data, the data reading method comprising:
- applying read voltages to memory cells of a non-volatile memory at different threshold levels to read data written to the memory cells of the non-volatile memory;
- storing first information indicating a first initial value for each different threshold level of the read voltages;
- storing second information that identifies whether data was successfully read from a sub-group of the memory cells when the respective different threshold levels of the read voltages are set to the first initial values, and
- storing third information that indicates a second initial value for each different threshold level of the read voltages for at least one sub-group for which a data reading was unsuccessful when a read voltage was set to the first initial value.

16. The memory system data reading method according to claim 15, wherein
- if the second information for a first sub-group indicates the data was successfully read when the respective different threshold levels of the read voltages were set to the first initial values, a subsequent reading of the first sub-group is performed using the first initial values for the different threshold levels, and
- if the second information for a second sub-group indicates the data was unsuccessfully read when the respective different threshold levels of the read voltages were set to the first initial values, a subsequent reading of the second sub-group is performed using the second initial values indicated by the third information.

17. The memory system data reading method according to claim 15, wherein the third information includes:
- first identification information indicating a first shift pattern among a plurality of shift patterns each including a combination of shift values for the different threshold levels of the read voltages, and
- second identification information indicating a second shift pattern among the plurality of shift patterns.

18. The memory system data reading method according to claim 17, wherein the bit size of the first identification information is less than the bit size of the second identification information.

19. The memory system data reading method according to claim 15, wherein
- the second information includes 1-bit information about each of the sub-groups, and
- a total data size of the third information is less than a total data size of the second information.

20. The memory system data reading method according to claim 15, wherein the third information includes a code obtained by encoding identification information for a plurality of shift patterns.

* * * * *